United States Patent [19]

Blanchet et al.

[11] Patent Number: 4,865,656

[45] Date of Patent: Sep. 12, 1989

[54] PROCESS FOR SURFACE PASSIVATION OF AN INDIUM PHOSPHIDE SUBSTRATE AND PRODUCT OBTAINED

[75] Inventors: Robert Blanchet, La Tour de Salvagny; Abdelkrim Choujaa, Ecully Cedex; Jacques Chave, Villeurbanne; Pierre Viktorovitch, Tassin la Demi Lune, all of France

[73] Assignee: Etablissement Public a Caractere Scientifique, France

[21] Appl. No.: 133,046

[22] PCT Filed: Mar. 25, 1987

[86] PCT No.: PCT/FR87/00093

§ 371 Date: Dec. 28, 1987

§ 102(e) Date: Dec. 28, 1987

[87] PCT Pub. No.: WO87/06058

PCT Pub. Date: Oct. 8, 1987

[30] Foreign Application Priority Data

Mar. 27, 1986 [FR] France ................................ 86 04647

[51] Int. Cl.$^4$ .................. H01L 21/288; H01L 21/314; H01L 29/20
[52] U.S. Cl. .................................... 148/33.3; 437/244; 437/946; 437/980; 357/23.2
[58] Field of Search ....................... 437/244, 946, 980; 148/DIG. 17, DIG. 119, DIG. 125, 33.3; 357/23.2, 23.15

[56] References Cited

FOREIGN PATENT DOCUMENTS 132326  1/1985  European Pat. Off. .

OTHER PUBLICATIONS

Sacilotti et al., Stabilization of InP Substrate Under Annealing in the Presence of GaAs, 320 (1986), Applied Physics Letters 48.

Blanchet et al., Reduction of Fast Interface States and Suppression of Drift Phoenomena in Arsenic-Stabilized Metal-Insulator-InP Structures, 320 (1985) Applied Physics Letters 46.

*Primary Examiner*—Olik Chaudhuri

[57] ABSTRACT

Surface passivation of indium phosphide substrate. The process consists in:

subjecting the substrate to cleaning without application of ultrasounds, soaking, for a duration of between 30 seconds and 10 minutes, the substrate in an aqueous solution of complex arsenic ions maintained at a temperature of between 0° and 50° C., abundantly rinsing the substrate in deionized water.

12 Claims, 4 Drawing Sheets

PROCESS FOR SURFACE PASSIVATION OF AN INDIUM PHOSPHIDE SUBSTRATE AND PRODUCT OBTAINED

TECHNICAL FIELD

The present invention relates to the technical domain of the manufacture of electronic and optoelectronic components, such as diodes, MIS (metal-insulator-semiconductor) components and it encompasses the manufacture of such components based on indium phosphide as a semiconductor.

Electronic components of such a type have already been produced and used more or less successfully. In fact, it has been ascertained that the operation of such components is largely dependent on the properties of the surface and interface between the semiconductor layer and the insulating layer. This seems connected with the process for obtaining an indium phosphide substrate, initially employing a mechanical cut-out or the like from a monocrystalline bar, then polishing the face intended to be coated with the insulating layer, with the physico-chemical characteristics of the indium phosphide and with the process for obtaining the insulating layer.

Such plates present, surface defects resulting from chemical or structural defects which behave like electron donor or acceptor traps opposing or disturbing the operation of an electronic structure.

In order to remedy this drawback, it comes to mind to compensate the surface defects of the semiconductor substrate.

In order to compensate for such defects though, it is not apparent to deposit on the surface a phosphorus or indium oxide, as a large number thereof exist which are all volatile or unstable and are therefore also generators of surface defects which are precisely sought to be compensated.

PRIOR ART

In an attempt to bring a solution to this problem, the prior art has proposed different methods of treatment.

One of them, disclosed by the Journal APPLIED PHYSICS LETTERS, Vol. 46 No. 4, pages 416 to 418 (15.2.85), consists of growing on the surface to be treated of an indium phosphide substrate an insulating layer composed of a phosphorus oxynitride intended to compensate the surface defects, itself coated with a second insulating layer (silica) complicating manufacture and giving the components properties of instability.

Furthermore, in order to cure the defects, the oxynitride must be of well defined composition, which is difficult to reproduce for a body like phosphorus oxynitride of which the content of phosphorus; nitrogen and oxygen is eminently variable.

A second known method, disclosed by the Journal IEEE, TRANSACTIONS ON ELECTRON DEVICES, Vol. ED 31 No. 8, pages 1038 to 1043 (1984), consists of an anodic oxidation of a predeposited layer of aluminium, the anodic oxidation being extended so that a phosphorus-rich oxide is constituted at the InP-alumina interface. Such a technique leads to a double-layer dielectric capable of provoking drifts of the operational characteristics of a component made from this technique, all the more so as the phosphorus oxide is unstable. Furthermore, such a method cannot be easily implemented for the manufacture of diodes.

A third method, recommended by the Journal JAPANESE JOURNAL OF APPLIED PHYSICS, Vol. 23 No. 8, pages 1157 and 1158 (1984), consists in depositing a phosphorus oxynitride which constitutes the whole gate insulator. A difficulty of reproducibility of the composition of this oxynitride and the difficulty of engraving it chemically constitute the major disadvantages of this method.

A fourth method, taught by the publication ELECTRONICS LETTERS, Vol. 19, No. 13, pages 459 to 461 (1983), consists in placing the indium phosphide substrate in a sealed bulb containing sulfur. The bulb is heated in order to produce, by sulfuration, an insulating layer which decomposes, provoking a loss of phosphorus and which necessitates being coated with a second insulating layer in order to limit the leakage currents. The components obtained are unstable.

A fifth method, due to the works of the inventors published in the Journal APPLIED PHYSICS LETTERS, Vol. 46, No. 8, pages 761 to 763 (1985), consists in placing the indium phosphide substrate in an enclosure under ultrahigh vacuum with the presence of arsenic under partial pressure. This technique, based on the aptitude of arsenic to improve the chemical stability and the electronic properties of the indium phosphide, probably by compensating the gaps of phosphorus, makes it possible to obtain a passivated surface state adapted to receive any subsequent deposit.

Such a method employs a rise in temperature higher than 500° C. and can therefore not be retained in the case of substrates already partly elaborated, unless a much more complex and very expensive process of treatment is employed consisting, in particular, in masking certain parts of the substrates with a product resisting the treatment, such as tantalum.

Such a method involves the establishment of a high vacuum, this leading to the use of heavy, complex and expensive equipment requiring highly qualified staff.

None of the known methods therefore appears to be capable of being retained to produce, in simple, certain and relatively inexpensive manner, an indium phosphide substrate presenting a surface state capable of furnishing, once coated with an insulating layer, electrical characteristics which are acceptable and constant in time for the industrial production of high-performance electronic components.

STATEMENT OF THE INVENTION

The object of the invention is to solve the problem thus raised by providing a process for surface passivation of indium phosphide substrates adapted to be used for the manufacture of various electronic or opto-electronic components, such as MIS structures, diodes, charge coupled devices, etc.

The object of the invention is to propose a novel, particularly simple process, not requiring any complex and expensive industrial installation and being able to be carried out without risk by not especially highly qualified staff.

In order to attain this object, the process of the invention is characterized in that it consists in:

subjecting the substrate to cleaning without application of ultrasounds, soaking, for a duration of between 30 seconds and 10 minutes, the substrate in an aqueous solution of complex arsenic ions maintained at a temperature of between 0° and 50° C., abundantly rinsing the substrate in deionized water.

The invention also has for its object, by way of novel products, an indium phosphide substrate obtained by carrying out this process and a component based on such a substrate.

Various other characteristics will appear from the description given hereinbelow and illustrated by the accompanying drawings.

BEST WAY OF CARRYING OUT THE INVENTION

Figure 1:
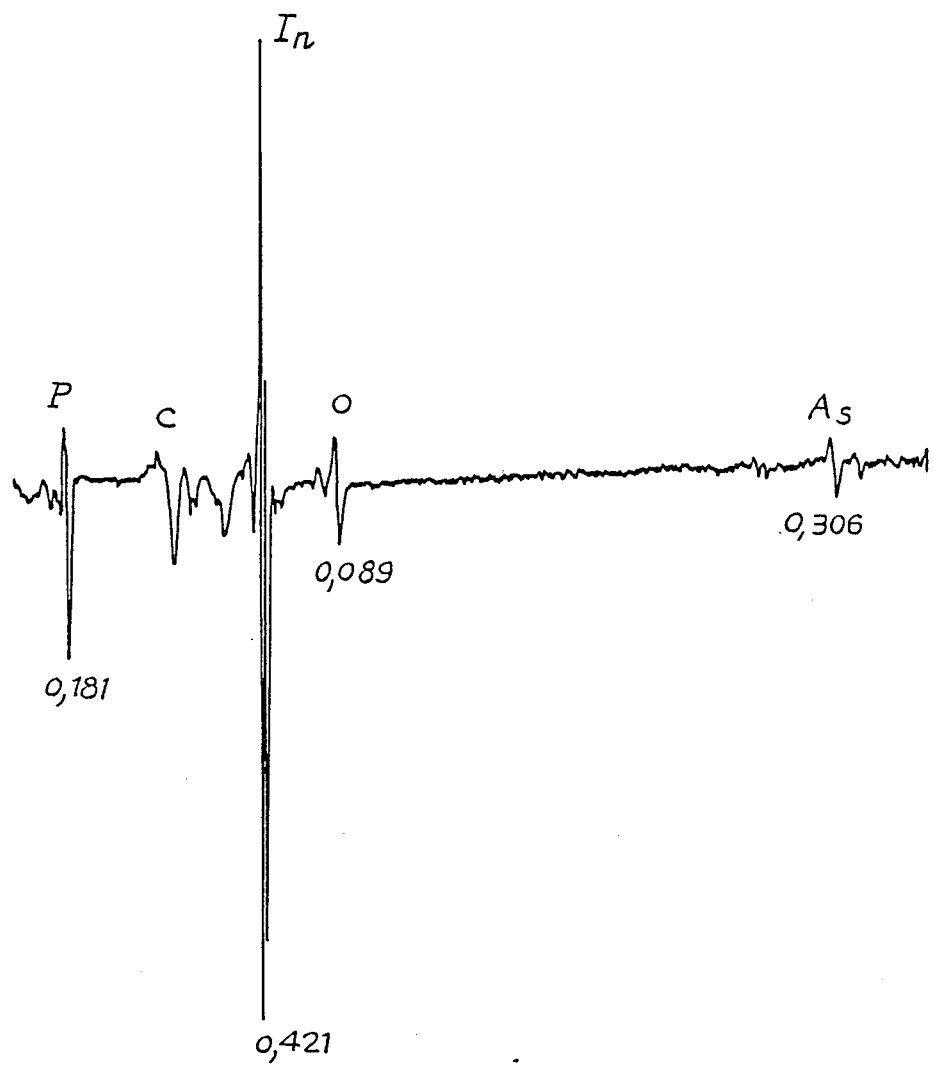
FIGS. 1 and 2, on the one hand, and 3 and 4, on the other hand, are schematic curves illustrating certain characteristics of an indium phosphide substrate treated according to the prior art method of exposure in an arsenic atmosphere under high vacuum and of a substrate of the same nature treated in accordance with the process of the invention.

According to the invention, the process for surface passivation of an indium phosphide substrate consists in subjecting the polished surface to be treated to a cleaning by any known process suitable for the indium phosphide and without application of ultrasounds. For example, a particularly suitable process of cleaning consists in using successive boiling baths of thichloroethylene (sic), acetone and methanol.

A second step of the process, carried out if necessary and therefore not imperative according to the process, consists of subjecting the substrate to a phase of pickling with a view to eliminating the presence of native oxide on the surface.

To that end, one method that may be used consists of soaking the substrate in a bath of bromine-methanol maintained at ambient temperature. The composition of this bath may employ a proportion of bromine included between 0.1 and 1%. The soaking phase continues for a duration of between 5 seconds and 3 minutes, then the substrate is rinsed abundantly with pure methanol. Subsidiarily, drying of the substrate in a jet of filtered nitrogen may occur.

Another method that may be envisaged consists in soaking the substrate in a 50% aqueous hydrofluoric acid solution for a duration equal to 3 minutes. The substrate is then rinsed abundantly in deionized water then possibly dried in filtered nitrogen.

Another step of the process of the invention then consists in soaking the substrate in an aqueous solution of complex arsenic ions having a pH lower than 4 and maintained at a temperature of between 0° and 50° C. and preferably between 10° and 25° C. The duration of soaking is included between 30 seconds and 10 minutes and is, more particularly, advantageously limited between 3 and 5 minutes.

Soaking is preferably effected in the dark and at least without direct illumination of the substrate.

The aqueous solution of complex arsenic ions may be on the basis of ortho-arsenic acid ($H_3AsO_4$) 34N or a solution based on arsenic salts.

In a variant, the soaking phase may also employ the application to the aqueous solution of an electrical potential variable as a function of time in the range of values in which the solution does not provoke a gaseous emission.

By way of example, the electrical potential resulting in the system comprising a solution of arsenic acid and an InP substrate, may be fixed or vary successively between values close to 1.4V in order to provoke a clean reaction of the solution with the InP, then values close to −0.3V in order to provoke the dissolution of the superficial layer furnished by the above reaction.

After the soaking phase, the substrate is subjected to abundant rinsing in deionized water then possibly dried in a jet of filtered nitrogen.

The substrate thus treated is characterized by a passivated surface state, chemically stable and presenting a good resistance to thermal degradation in vacuo up to surface temperatures close to 450° to 480° C., all characteristics favourable for the deposit of an insulating layer of any nature. Such a substrate is characterized, furthermore, by a reduction in the density of the surface states and a stabilization of the electronic properties making it possible to manufacture, on such a base, high-performance electronic or opto-electronic components having satisfactory characteristics stable in time.

Figure 2:
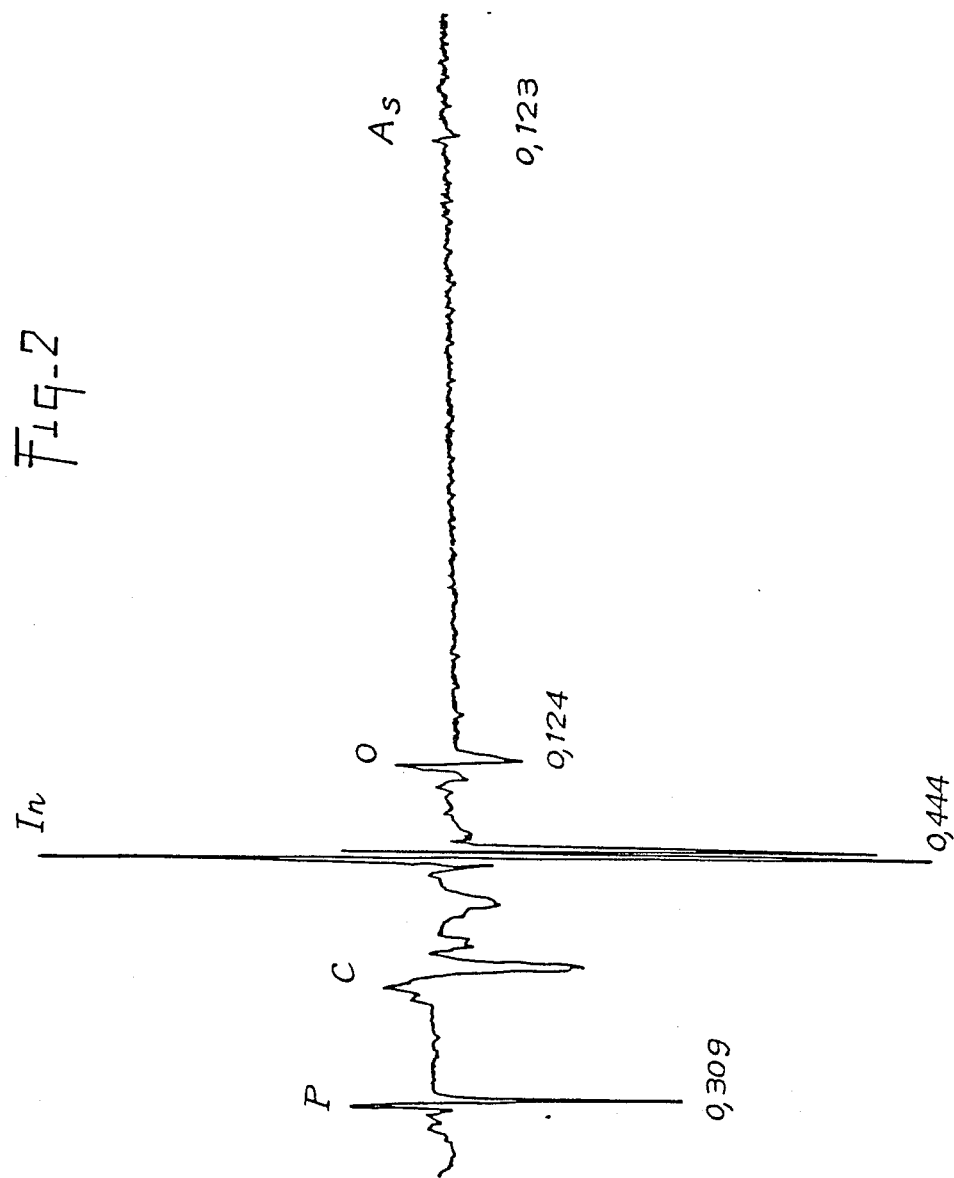

The above advantages are due to the novel physical characteristics of the substrate thus treated, which are demonstrated by AUGER electron spectrometry. FIG. 1 shows an AUGER electron spectrum corresponding to a sample of indium phosphide treated under ultrahigh vacuum in the presence of arsenic according to the prior known method described previously, while FIG. 2 corresponds to a sample treated according to the invention. In these spectra, the magnitudes plotted in relation with the identified peaks correspond to relative values reduced to the sum of the components represented by all the peaks.

A comparison of these two curves demonstrates, a noteworthy reduction of the height of the arsenic peak in accordance with the present invention. The experiments carried out have shown that the relative arsenic peak corresponding to the invention is always less than 70% of the relative arsenic peak of a substrate of the same nature treated under partial pressure of arsenic.

Figure 3:
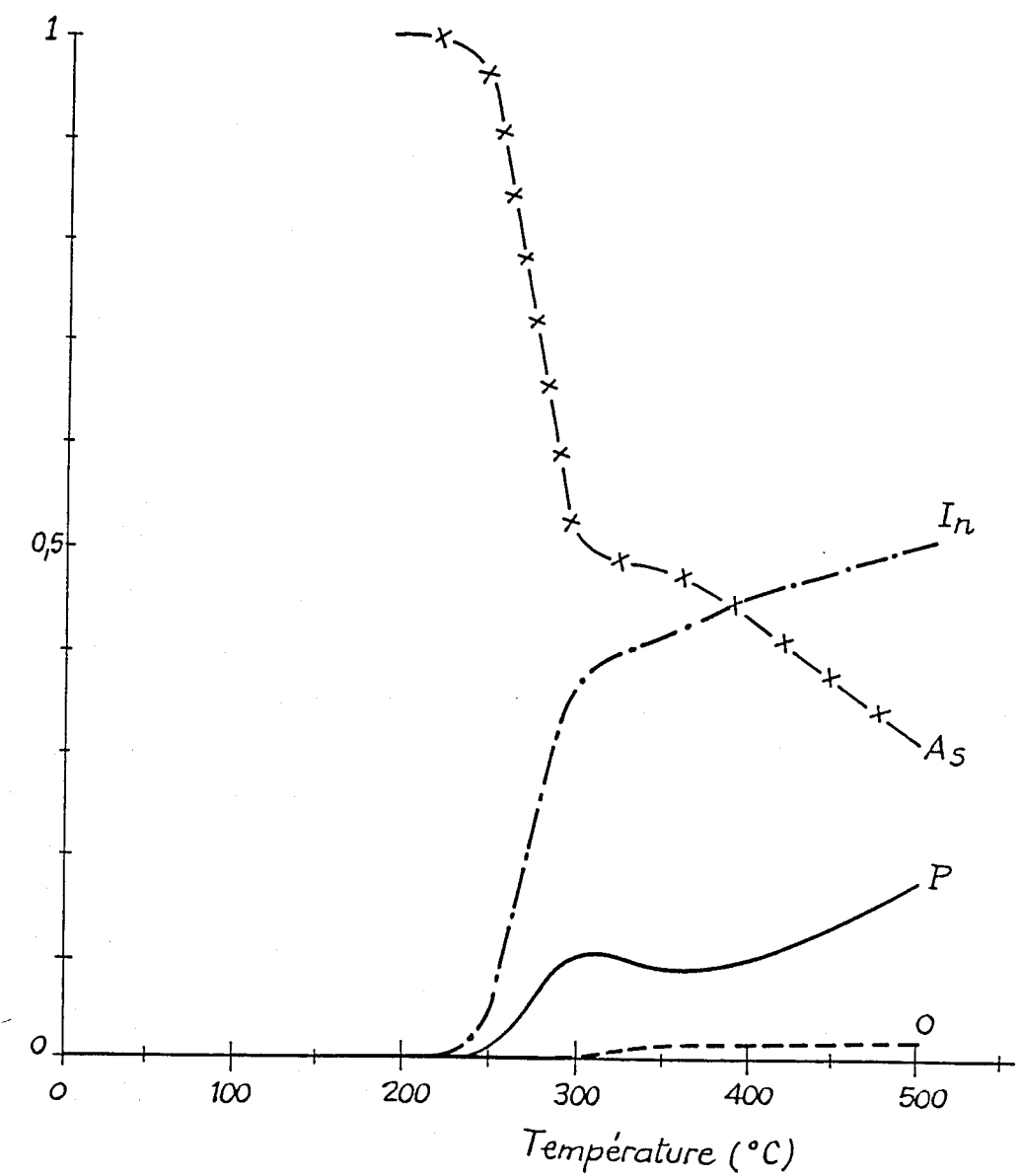
Figure 4:
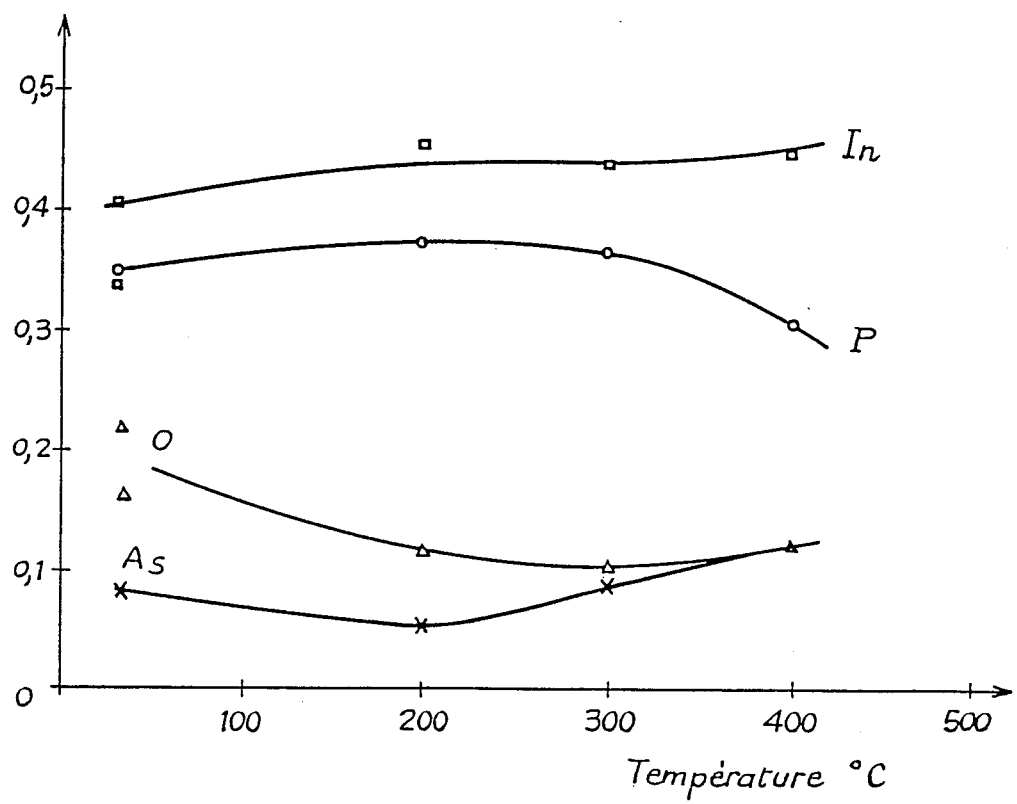

FIGS. 3 and 4, correspond respectively to two samples treated according to the first method and according to the invention, show the relative evolution of the indium (In), phosphorus (P), oxygen (O) and arsenic (As) AUGER peaks after heating to increasing temperatures and in vacuo.

A comparison of these curves demonstrates very distinctive variations in profiles of curves. It will be noted that the variations of peaks as a function of the temperature are much greater in FIG. 3 than in FIG. 4 which corresponds to the invention and for which it may be considered that they are virtually constant. In particular, it may be noted that the arsenic peak according to the prior technique varies appreciably in the whole range of temperatures and even in considerable manner before 300° C.

Accordingly, the process according to the invention presents, the advantage of being simple to carry out, of requiring only light, inexpensive equipment and of being able to be carried out by staff not especially highly qualified.

In addition, this process is characterized by the absence of heating of the sample and by the possibility of localized treatment, this enabling it to be carried out at any stage whatsoever of a process of manufacturing an electronic or opto-electronic component, without provoking rediffusion of impurities due to a possible heating.

POSSIBILITY OF INDUSTRIAL APPLICATION

The invention is particularly adapted to the manufacture of metal-insulator-semiconductor components.

We claim:

1. A process for surface passivation of an indium phosphide substrate comprising the steps of:
   (a) subjecting said indium phosphide substrate to cleaning without the use of ultrasound;
   (b) soaking said substrate in an aqueous solution of complex arsenic ions maintained at a temperature between 0° and 50° C. for a duration of between about 30 seconds and 10 minutes; and
   (c) rinsing said substrate in deionized water.

2. The process according to claim 1 wherein said solution of complex arsenic ions has a pH lower than about 4.

3. The process according to claim 1 wherein said solution comprises ortho-arsenic acid.

4. The process according to claim 1 wherein said solution of complex arsenic ions comprises one or more arsenic salts.

5. The process according to claim 1 wherein said solution of complex arsenic ions is maintained at a temperature of between about 10° and 25° C. during said soaking step.

6. The process according to claim 1 wherein said step of soaking said indium phosphide substrate in said solution of complex arsenic ions includes the application of an electrical potential.

7. The process according to claim 1 wherein said indium phosphide substrate is soaked in said solution of complex arsenic ions for a duration of between about three and five minutes.

8. The process according to claim 1 wherein said indium phosphide substrate is soaked in said solution of complex arsenic ions in the absence of a source of illumination.

9. The process according to claim 1 comprising the intervening step, after said step of cleaning said indium phosphide substrate, of subjecting said substrate to pickling, whereby the native oxide of said substrate is eliminated.

10. The process according to claim 9 wherein said pickling is effected by soaking said indium phosphide substrate in a bath of bromine-methanol followed by rinsing in pure methanol.

11. The process according to claim 9 wherein said pickling is effected by soaking said indium phosphide substrate in a 50% aqueous hydrofluoric acid solution followed by rinsing said indium phosphide substrate in deionized water.

12. An indium phosphide substrate treated at least locally during at least one of its manufacturing steps in accordance with the process of one of claims 1 through 11, said indium phosphide substrate having an arsenic peak of less than 70% of the arsenic peak of a substrate of the same nature treated under partial pressure of arsenic, as measured by AUGER spectrometry applied to the treated part.

* * * * *